United States Patent [19]

Takiguchi et al.

[11] Patent Number: 4,900,930

[45] Date of Patent: Feb. 13, 1990

[54] ALPHA-RAY IMAGE DETECTING APPARATUS

[75] Inventors: Yoshihiro Takiguchi; Katsuyuki Kinoshita, both of Shizuoka, Japan

[73] Assignee: Hamamatsu Photonics Kabushiki Kaisha, Shizuoki, Japan

[21] Appl. No.: 270,459

[22] Filed: Nov. 8, 1988

Related U.S. Application Data

[63] Continuation of Ser. No. 878,067, Jun. 24, 1986.

[30] Foreign Application Priority Data

Jun. 25, 1985 [JP] Japan .................................. 60-138411

[51] Int. Cl.4 ............................................. H01J 31/50
[52] U.S. Cl. ............................... 250/361 R; 250/472.1
[58] Field of Search ....... 250/213 VT, 361 R, 370.02, 250/370.11, 389, 397, 472.1, 483.1; 313/103 CM, 105 CM, 380, 382, 383, 541, 544

[56] References Cited

U.S. PATENT DOCUMENTS

| 2,960,416 | 11/1960 | Reed ..................................... 427/69 |
| 3,541,331 | 11/1970 | Hunt, Jr. et al. .................. 250/336.1 |
| 4,069,421 | 1/1978 | Bourdel ............................ 250/363 S |
| 4,350,919 | 9/1982 | Johnson et al. ....................... 313/529 |
| 4,527,064 | 7/1985 | Anderson ............................. 250/374 |
| 4,667,107 | 5/1987 | Wang ................................... 250/390 |

FOREIGN PATENT DOCUMENTS 2178592  2/1987  United Kingdom ............ 250/361 R

Primary Examiner—Constantine Hannaher
Attorney, Agent, or Firm—Finnegan, Henderson, Farabow, Garrett and Dunner

[57] ABSTRACT

An alpha-ray image detecting apparatus detects the image of alpha-rays emitted from nuclides of a substance by analyzing the electrons emitted from the substance. The apparatus includes a vacuum chamber having a layer of fluorescent material at one end and an electronic optical system for multiplying the emitted electrons and focusing the emitted electrons on the fluourescent layer.

6 Claims, 5 Drawing Sheets

ALPHA-RAY IMAGE DETECTING APPARATUS

This application is a continuation of application Ser. No. 06/878,067, filed June 24, 1986.

FIELD OF THE INVENTION

This invention relates to an alpha-ray image detecting apparatus for taking the image of electrons generated by movement of alpha-rays and detecting the image of the alpha-rays which have caused the generation of the electrons.

BACKGROUND OF THE INVENTION

In order to detect the image of an alpha-ray radiating nuclides, a method is known in the art in which a scintilator is arranged adjacent to a radioactive substance including the alpha-ray radiating nuclides, to convert the alpha-rays into optical signals to form the image thereof.

As is well known in the art, alpha-rays are radiated from the atomic nucleus, and its mass is about 7300 times that of an electron. As the range of each alpha-ray is short in a substance, the alpha-rays are absorbed by the substance itself and, therefore, only the alpha-rays radiated from the surface of the substance can be obtained for processing as data. In order to obtain the data of the alpha-rays thus radiated, it is necessary to bring the scintillator in close contact with the substance and this often causes the substance to be physically deformed.

OBJECTS AND SUMMARY OF THE INVENTION

An object of the present invention is an alpha-ray image detecting apparatus for determining the image of alpha-rays emitting electrons from a substance.

Another object of the present invention is an improved alpha-ray image detecting apparatus.

A further object of the present invention is an alpha-ray image detecting apparatus that does not physically deform the substance emitting the alpha-rays.

These and other objects are accomplished by an alpha-ray image detecting apparatus comprising a vacuum container, a fluorescent layer formed on an inner surface of the container, and an electronic optical system for multiplying electrons emitted from alpha-ray radiating nuclides in the surface of the substance and for focusing the multiplied electrons on the fluorescent layer.

The manner by which the above objects, other object, features and advantages of the present invention are attained will become fully apparent from the following detailed description when it is considered in view of the drawings, wherein.

DETAILED DESCRIPTION OF THE PREFFERED EMBODIMENTS

Figure 1:
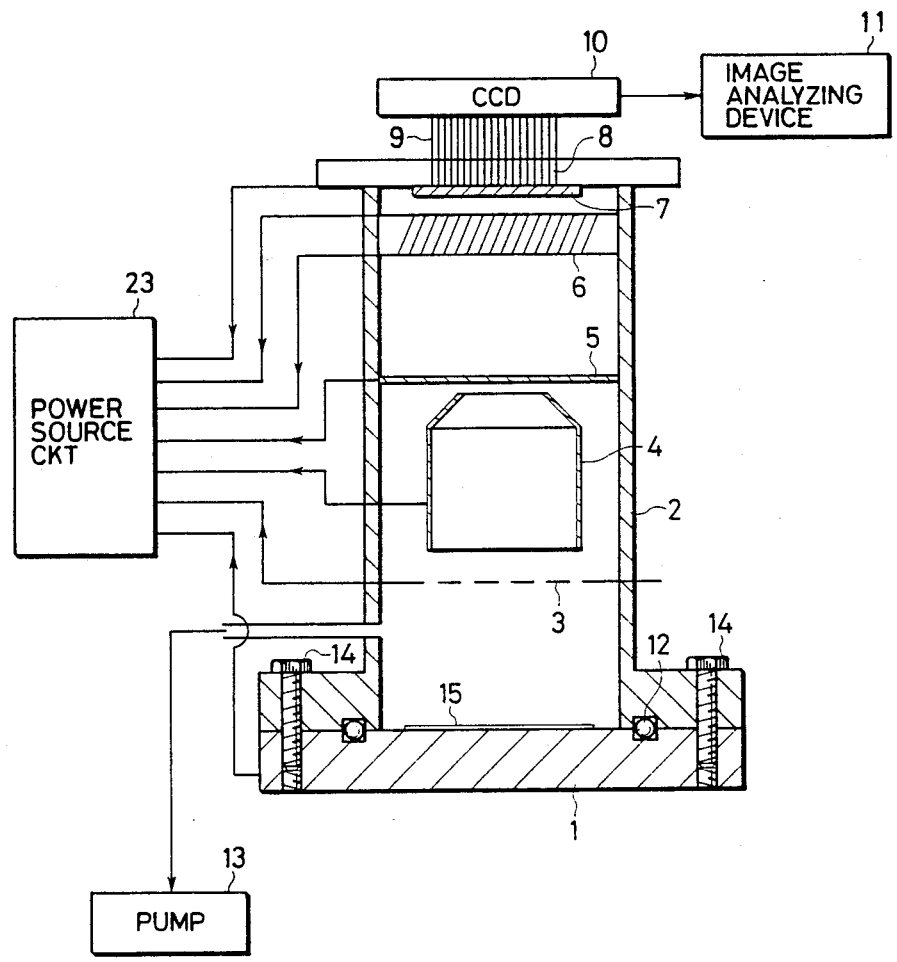
FIG. 1 is an explanatory diagram of a first embodiment of an alpha-ray image detecting apparatus according to the present invention.

FIG. 1 is an explanatory diagram showing a first example of a first alpha-ray image detecting apparatus and its relevant devices.

A specimen 15 including nuclides that radiate alpha-rays is placed on a stand 1, in which an annular groove is formed to receive a vacuum forming seal member, namely, an O-ring 12. A cylinder 2 is placed through the O-ring on the stand 1, and secured to the stand 1 with bolts 14. The cylinder 2 is evacuated by a vacuum pump 13.

A mesh electrode 3, a focus eletrode 4, an aperture electrode 5, and a micro-channel plate 6 are arranged vertically in the cylinder 2 in the stated order. More specifically, the focus electrode 4 is positioned above the mesh electrode 3, the aperture electrode 5 is placed above the focus electrode 4, and the micro-channel plate 6 is positioned above the aperture electrode 5.

The upper end face of the cylinder 2 is an image projecting surface. A fluorescent layer 7 is formed on the inner surface of the upper end face.

A drive power source circuit 23 is provided to apply operating voltages to the stand 1, the mesh electrode 3, the focus electrode 4, the aperture electrode 5, the micro-channel plate 6, and the fluorescent layer 7.

The mesh electrode 3 is used to accelerate the electrons towards the fluorescent layer 7 which are emitted from the specimen 15 by the alpha-rays in the specimen 15.

The mesh electrode 3, the focus electrode 4 and the aperture electrode 5 form an electronic optical system for applying to the input surface of the micro-channel plate 6 the electrons that are emitted from the surface of the substance by the elastic scattering of the alpha-rays and the electrons in the substance.

The electrons applied to the micro-channel plate 6, after being multiplied, are applied to the fluorescent layer 7. The light beam of the incident electron image is applied to a CCD image pickup device 10 through a glass fiber plate 8 provided in the top end face of the cylinder 2 and a glass fiber plate 9 connected to the glass fiber plate 8.

The light beam from the fluorescent layer is read by the CCD image pickup device 10, the output of which is applied to an image analyzing device 11, where the image is analyzed.

Figure 2:
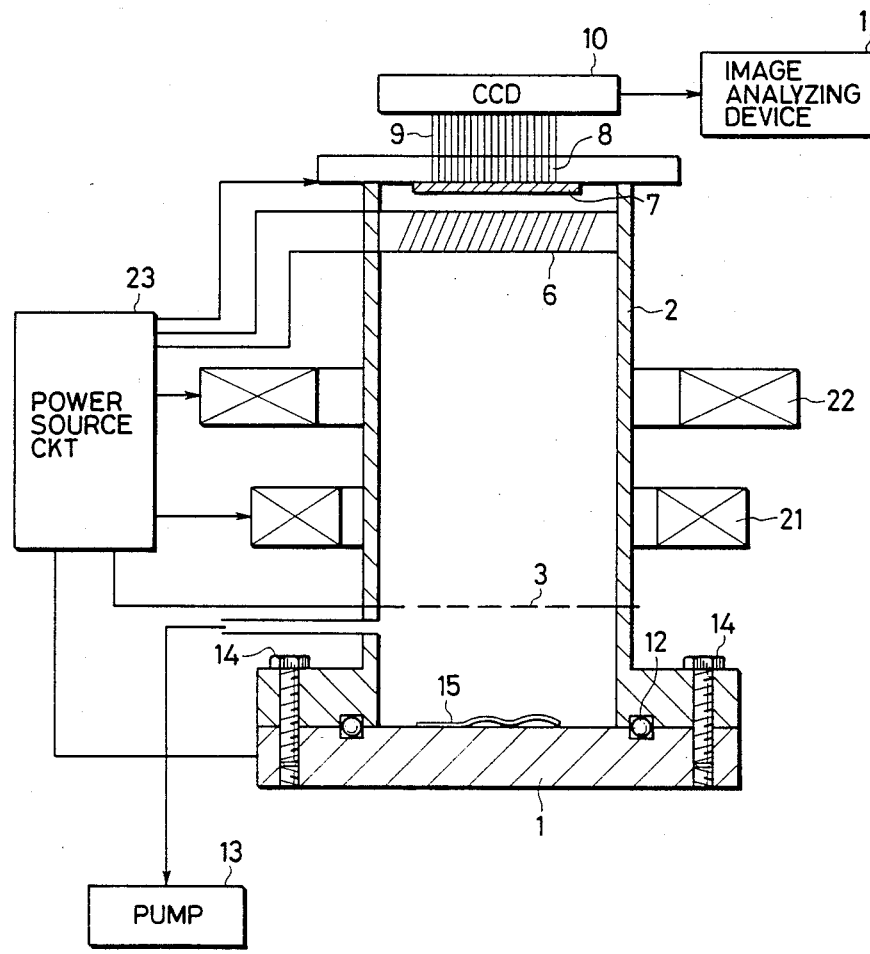
FIG. 2 is an explanatory diagram of a second embodiment of an alpha-ray image detecting apparatus according to the present invention.

FIG. 2 is a diagram showing a second embodiment of the alpha-ray image detecting apparatus according to the present invention. In FIG. 2, those components which have been previously described with reference to FIG. 1 are designated by the same reference numerals.

The above-described apparatus can be obtained by employing electromagnetic coils 21 and 22 instead of the electronic optical system in the apparatus of FIG. 1. The other components of the apparatus of FIG. 2 are the same as those of the apparatus of FIG. 1.

The drive power source circuit 23 applies operating voltages to the various electrodes and operating voltages and currents to the electromagnetic coils 21 and 22.

The apparatus of FIG. 2 can be utilized for measurement of plutonium pollution.

In the reprocessing of nuclear fuel, a matter "plutonium" is present which is strongly poisonous. If a leakage of plutonium occurs in the reprocessing plant, it is essential to detect the degree of plutonium pollution, and the particle size distribution of plutonium. In this case, the surface of a floor polluted with plutonium is wiped with a filter paper according to the smear method. The filter paper is put, as the specimen 15, in the cylinder, and the cylinder is evacuated.

In this connection, if the surface area of the specimen is enlarged about 100 times by using the enlarging electronic lens system and the deflecting system of the apparatus, then the particle size distribution can be obtained with a resolution of several micrometers ($\mu$ m).

If the alpha-ray emission rate of the specimen is obtained by operating the image analyzing device 11 in a counting mode, the degree of pollution can be obtained from the count value of the device 11. The above-described apparatus can be utilized for measurement of the uniformity of nuclear fuel.

The fuel uranium used for nuclear power generation is sintered in the form of pellets in order to increase the nuclear fission efficiency. In this case, cracks or the like in the structure of the pellets cause a loss in conduction of the heat obtained through nuclear reaction. This is an important cause of problems in nuclear power generations.

In the conventional alpha-ray image method, the spatial resolution is of the order of 100 $\mu$ m; however, it can be increased with the apparatus of the present invention.

Figure 3:
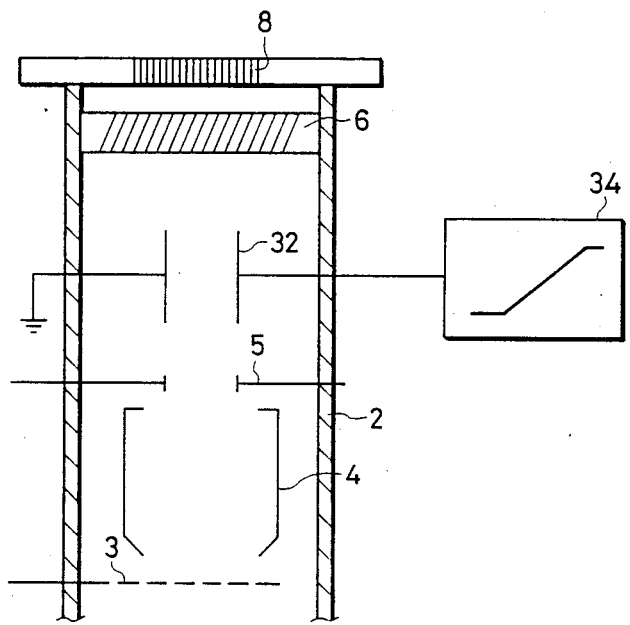
FIG. 3 is an explanatory diagram of an electronic optical system for use in the alpha-ray image detecting apparatus of FIG. 1.

FIG. 3 shows another embodiment of the electronic optical system in the alpha-ray image detecting apparatus according to the present invention. In this example, the electronic optical system employs a streak tube well known in the art. The electrons emitted from the specimen (not shown) are accelerated by a mesh electrode 3, and focused by means of a focus lens 4 and an aperture electrode 5.

A deflecting voltage generator 34 applies a deflecting voltage to the deflecting electrode 32 of the apparatus so that the electrons passing through the deflecting electrode 32 are deflected to reach the microchannel plate 6. The electrons, being multiplied by the micro-channel plate 6, form a streak image on the fluorescent layer 7.

The apparatus can measure the variation in the behaviour of alpha-rays.

Figure 4:
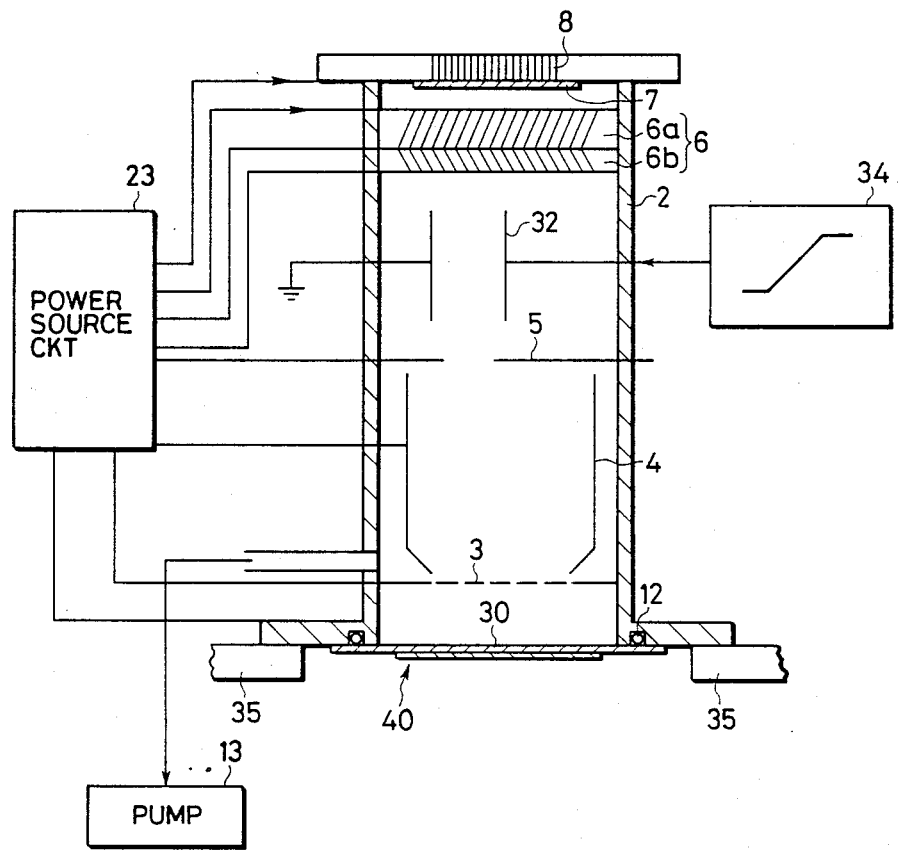
FIG. 4 is an explanatory diagram of a third embodiment of an alpha-ray image detecting apparatus of the present invention.

FIG. 4 shows a first example of a third embodiment of the alpha-ray image detecting aparatus according to the present invention. In the above-described alpha-ray image detecting devices of FIGS. 1–3, the specimen is placed in the vacuum container, and the image of the electron beam attributing to alpha-rays emanating from the specimen is formed. In the example of FIG. 4, the specimen is placed outside the vacuum container to detect the alpha-ray image.

The apparatus shown in FIG. 4 employs the streak tube electronic optical system shown in FIG. 3. Furthermore, the apparatus employs two micro-channel plates 6a and 6b to increase the multiplication factor of the resultant image. In FIG. 4, those components which have been previously described with reference to FIGS. 1 thourgh 3 are designated by the same reference numerals.

In FIG. 4, an aluminum plate 30 together with the cylinder 2 forms a vacuum container. An uranium oxide layer 40 is vacuum-deposited on one surface of the aluminum plate 30 to a thickness of 1 $\mu$ m to 3 $\mu$ m, to observe the natural alpha decay of uranium. Preferably, the uranium oxide layer 40 is 1 $\mu$ m to enhance the passage of electrons.

The aluminum plate 30 having the specimen formed by vacuum deposition is brought into close contact with the cylinder 2 thorugh the O-ring 12 to form a chamber, and the chamber thus formed is evacuated by the vacuum pump 13. The uranium radiated alpha-rays with a half life of about $4.5 \times 10^9$ years through natural 238U alpha decay. The distribution of the number of secondary electrons emitted inside the vacuum container by one alpha decay, which is measured by the above-described apparatus, is as shown in FIG. 5.

Figure 5:
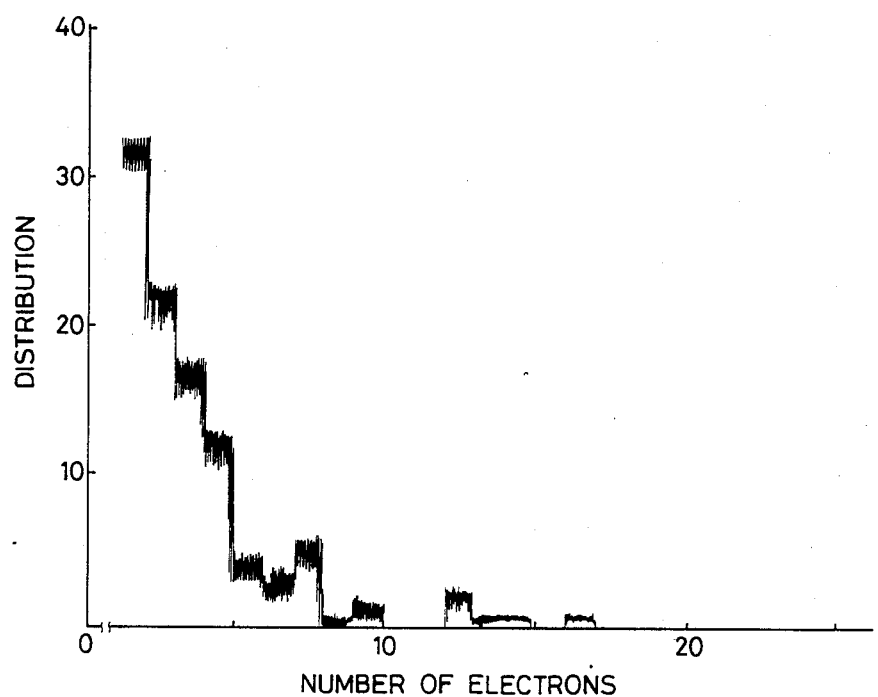
FIG. 5 is a graphical representation indicating the distribution of the number of electrons during alphadecay in the apparatus of FIG. 4 in the case where the uranium layer is formed on the inside of the metal plate.

As is apparent from FIG. 5, the average number of secondary electrons is 4.43. However, it should be noted that all the secondary electrons emitted inside the vacuum container contribute to the image pickup operation.

It can be considered that some of the electrons cannot form bright points in the fluorescent layer 7 because of the presence of the mesh electrode 3 and the micro-channel plate 6. Therefore, it can be estimated that when correction is made according to the numerical aperture of the mesh electrode 3 and the micro-channel plate 6, the number of electrons emitted inside the vacuum container by one alpha decay is approximately twelve (12).

With the above-described apparatus, the position of generation and the frequency of generation of alpha-rays can be obtained. Therefore, the apparatus can be utilized for measurement of the uniformity of the uranium vacuum deposited surface. For instance, the apparatus can be used to estimate the uniformity of the uranium vacuum deposited surface in a device such as a fission chamber utilizing neutron-electron variation.

In the above-described apparatus, the uranium oxide layer 40 is vacuum-deposited on the surface of the aluminum plate 30. If the aluminum plate 30 is directed towards the alpha-ray radiation source (for instance, nuclear fusion), then the aluminum plate 30 can be used as a metal target, and therefore it can be utilized for analysis of the nuclear-fusion genertaed alpha-ray image.

Alpha ($\alpha$) rays such as those in laser nuclear fusion whose duration is less than a nano-second may be applied, in the form of a pulse signal, to the metal target 30 (of gold or aluminum having a thickness of about 1 $\mu$ m) where they are converted into electrons for the imaging of pulse alpha-rays with high time resolution. The imaging and the time resolution measurement of the alpha ray pulse provided by the laser nucler fusion are essential for studying the mechanism of nuclear fusion reaction.

In the above-described embodiments, the microchannel plate is employed. However, the use of the microchannel plate is not always required when a sufficient number of electrons can be emitted or the measurement can be made over a long period of time.

As was described in detail, the first alpha-ray image detecting apparatus of the present invention comprises a vacuum container for accomodating a substance including an alpha-ray radiating nuclide, a fluorescent layer formed on the inner surface of the container, and an electronic optical system for applying to the fluorescent layer the electrons that are emitted from the surface of the substance by the elastic scattering of the alpha-rays in the substance with the electrons in the substance. The image corresponding to the behavior of the alpha-rays in the specimen including the alpha-ray radiating nuclides can be detected by detecting the electrons corresponding to the behavior of the alpha-rays radiated from the surface of the specimen. As was described before, the apparatus of the present invention can be utilized for measurement of the uniformity of a nuclear fuel and for measurement of plutonium pollution.

Another embodiment of the alpha-ray image detecting apparatus of the present invention comprises a vacuum container, a thin metal plate from which electrons are emitted into the container by alpha-rays generated outside the container, a fluorescent layer formed on an inner surface of the container, and an electronic optical system for applying to the fluorescent layer the electrons which the thin metal plate emits in response to the alpharays, to detect the image corresponding to the alpha-rays applied to the metal plate.

With this embodiment, an image corresponding to the behavior of the alpha-rays generated outside the container can be detected. The apparatus can be utilized for measurement of the uniformity of an uranium vacuum-deposited surface and for measurement of an alpha-ray image formed during nuclear fusion.

While several preferred embodiments of the presesnt invention have been described, it will be obvious to those skilled in the art that various changes and modifications may be made without departing from the spirit and scope of the following claims.

What is claimed is:

1. An alpha-ray image detecting apparatus comprising:
    a vacuum container for holding in a vacuum within the container a substance including alpha-ray radiating nuclides;
    a fluorescent layer formed on an inner surface of the container; and
    a system for multiplying electrons emitted from the alpha-ray radiating nuclides in the surface of the substance and for focusing the multiplied electrons on said fluorescent layer.

2. An alpha-ray image detecting apparatus according to claim 1, further including a support on the opposite end of said container opposite from said fluorescent layer for supporting the substance.

3. An alpha-ray image detecting apparatus according to claim 2, wherein said system comprises:
    a mesh electrode;
    a focus electrode;
    an aperture electrode; and
    a micro-channel plate arranged between said support and said fluorescent layer.

4. An alpha-ray image detecting apparatus according to claim 3, further including a pump for evacuating said vacuum container.

5. An alpha-ray image detecting apparatus according to claim 2, wherein said system comprises;
    a micro-channel plate proximate said fluorescent layer;
    an electromagnetic coil between said support and said micro-channel plate; and
    a drive power circuit for applying operating voltages to said electromagnetic coil and said micro-channel plate.

6. An alpha-ray detecting apparatus according to claim 5, further including a pump for evacuating said vacuum container.

* * * * *